United States Patent
Tran

(10) Patent No.: US 8,642,421 B2
(45) Date of Patent: *Feb. 4, 2014

(54) LIGHT-EMITTING DIODE DEVICE STRUCTURE WITH $Si_xN_y$ LAYER

(75) Inventor: Chuong Anh Tran, Hsinchu County (TW)

(73) Assignee: SemiLEDS Optoelectronics Co., Ltd., Chu-Nan (TW)

( * ) Notice: Subject to any disclaimer, the term of this patent is extended or adjusted under 35 U.S.C. 154(b) by 119 days.

This patent is subject to a terminal disclaimer.

(21) Appl. No.: 13/355,322

(22) Filed: Jan. 20, 2012

(65) Prior Publication Data

US 2012/0112163 A1    May 10, 2012

Related U.S. Application Data

(63) Continuation-in-part of application No. 12/120,768, filed on May 15, 2008, now Pat. No. 8,129,237.

(51) Int. Cl.
*H01L 21/8234* (2006.01)

(52) U.S. Cl.
USPC ........... 438/237; 438/328; 438/979; 257/576; 257/656; 257/910; 257/E25.032; 257/E27.051

(58) Field of Classification Search
USPC ..... 438/237, 328, 979, FOR. 157, FOR. 287, 438/FOR. 416; 257/13, 576, 656, 910, 257/E25.032, E27.051, E27.046, E31.084, 257/E31.105

See application file for complete search history.

(56) References Cited

U.S. PATENT DOCUMENTS

| | | | |
|---|---|---|---|
| 3,907,616 A | 9/1975 | Wiemer | |
| 6,744,071 B2 | 6/2004 | Sano et al. | |
| 7,186,580 B2 | 3/2007 | Tran et al. | |
| 7,825,432 B2 | 11/2010 | Saxler et al. | |
| 2007/0148923 A1 | 6/2007 | Kim et al. | |
| 2007/0166851 A1 | 7/2007 | Tran et al. | |
| 2007/0190676 A1 | 8/2007 | Chu et al. | |
| 2008/0142814 A1 | 6/2008 | Chu et al. | |
| 2010/0276665 A1 | 11/2010 | Wang | |

OTHER PUBLICATIONS

J. Xie et al., "Low dislocation densities and long carrier lifetimes in GaN thin films grown on a SiNx nanonetwork," Applied Physics Letters, 2007 vol. 90: pp. 041107-1-041107-3.

Y.T. Moon et al., "A study of the morphology of GaN seed layers on in situ deposited SixNy and its effect on properties of overgrown GaN epilayers," Journal of Crystal Growth, 2006 vol. 291: pp. 301-308.

*Primary Examiner* — Alexander Sofocleous
*Assistant Examiner* — Joannie A Garcia
(74) *Attorney, Agent, or Firm* — Stephen A. Gratton

(57) ABSTRACT

A light-emitting diode (LED) structure fabricated with a $Si_xN_y$ layer responsible for providing increased light extraction out of a surface of the LED is provided. Such LED structures fabricated with a $Si_xN_y$ layer may have increased luminous efficiency when compared to conventional LED structures fabricated without a $Si_xN_y$ layer. Methods for creating such LED structures are also provided.

18 Claims, 9 Drawing Sheets

LIGHT-EMITTING DIODE DEVICE STRUCTURE WITH $Si_xN_y$ LAYER

CROSS-REFERENCE TO RELATED APPLICATIONS

This application is a continuation-in-part of co-pending U.S. patent application Ser. No. 12/120,768, filed May 15, 2008, which is herein incorporated by reference.

BACKGROUND OF THE INVENTION

1. Field of the Invention

Embodiments of the present invention generally relate to the field of light-emitting diode (LED) technology and, more particularly, to a light-emitting diode (LED) structure with increased light extraction.

2. Description of the Related Art

Luminous efficiency of LEDs can be defined as the total apparent power of a light source to its actual total input power (luminous flux divided by input power). Having units of lumens per watt, luminous efficiency measures the fraction of power which is useful for lighting. As a type of light source, light-emitting diodes (LEDs) have been designed and developed over the past few decades to make improvements in luminous efficiency and increase the number of possible applications for these solid state devices.

Beginning with a conventional LED structure whose cross-section is shown in FIG. 1, one can see why the luminous efficiency of these devices is relatively poor. A conventional LED 100 is formed on a substrate 104 such as sapphire, silicon carbide, silicon, germanium, ZnO or gallium arsenide depending on the composition of the LED layers to be deposited. An n-doped layer 102 is disposed above the substrate 104, and this layer 102 may comprise n-doped GaN. GaN may be grown on a sapphire substrate for emitting green to ultraviolet (UV) wavelengths of light. A multiple quantum well (MQW) active layer 103 is deposited above the n-doped layer 112, and this is where photon generation occurs when the diode is properly biased. A p-doped layer 106 is grown above the active layer 103 in FIG. 1. After portions of the p-doped layer 106 and the active layer 103 are removed to expose a portion of the n-doped layer 102, electrodes 108 and 110 may be formed on the p-doped and n-doped layers, respectively, for forward biasing the LED.

To improve upon some of the design limitations for luminous efficiency of conventional LEDs, the vertical light-emitting diode (VLED) structure was created. The VLED earned its name because the current flows vertically from p-electrode to n-electrode, and a typical VLED 200 is shown in FIG. 2. To create the VLED 200, an n-doped layer 102 is deposited on a substrate (not shown), and this may comprise any suitable semiconductor material for emitting the desired wavelength of light, such as n-GaN or a combination of undoped GaN and n-GaN. A multiple quantum well (MQW) active layer 103 from which the photons are emitted is grown above the n-doped layer 102. A p-doped layer 106 is deposited above the active layer 103 in FIG. 2. A metal layer 202 may be deposited above the p-doped layer 106 for electrical conduction and heat dissipation away from the VLED.

Unwanted dislocations 112 may form in an LED during the growing of one or more of the layers that make up the LED. In conventional LEDs, current flows along the surface very far from the interface of the substrate 104 and the n-doped layer 102 so the effects of dislocations on current are not obvious. Unwanted dislocations may also occur in a VLED, and because the dislocations in a VLED may run in the direction of the current, reductions in the dislocation density may have a more noticeable effect on decreasing the leakage current. Leakage current, as defined herein, generally refers to the current measured when −5V of reversed bias is applied to the LED electrodes.

Accordingly, what is needed is a light-emitting solid state device with reduced dislocation density and increased luminous efficiency.

SUMMARY OF THE INVENTION

One embodiment of the present invention provides a method of increasing light extraction from a light-emitting diode (LED) device. The method generally includes depositing a first n-doped layer above a carrier substrate; depositing a $Si_xN_y$ mask above the first n-doped layer, wherein the $Si_xN_y$ mask has openings exposing portions of the first n-doped layer; depositing a second n-doped layer above the $Si_xN_y$ mask such that the second n-doped layer is also deposited in the openings; and depositing a p-doped layer above the active layer, such that the $Si_xN_y$ mask reduces dislocations in at least one of the second n-doped layer, the active layer, and the p-doped layer.

Another embodiment of the present invention provides an LED device. The LED device generally includes a carrier substrate; a first n-doped layer disposed above the carrier substrate; a $Si_xN_y$ mask disposed above the first n-doped layer, wherein the $Si_xN_y$ mask has openings exposing portions of the first n-doped layer; a second n-doped layer disposed above the $Si_xN_y$ mask such that the second n-doped layer is also disposed in the openings; an active layer for emitting light disposed above the second n-doped layer; and a p-doped layer disposed above the active layer, wherein a first dislocation density above the $Si_xN_y$ mask is lower than a second dislocation density below the $Si_xN_y$ mask.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention provide a light-emitting diode (LED) structure fabricated with a $Si_xN_y$ layer responsible for providing increased light extraction out of a surface of the LED. Embodiments of the present invention also provide for a method of creating such an LED.

An Exemplary Led Device Having a $Si_xN_y$ Layer

The depositing of a $Si_xN_y$ layer may reduce the dislocation density in the layers of an LED and lead to increased light extraction. FIGS. 3A-3F illustrate various steps in the fabrication of an LED according to an embodiment of the invention.

Figure 1:
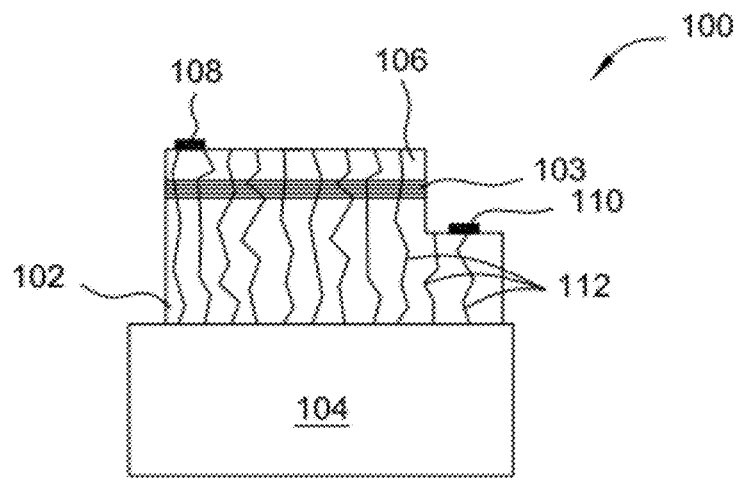
FIG. 1 is a cross-sectional schematic representation of a prior art light-emitting diode (LED) structure.
Figure 2:
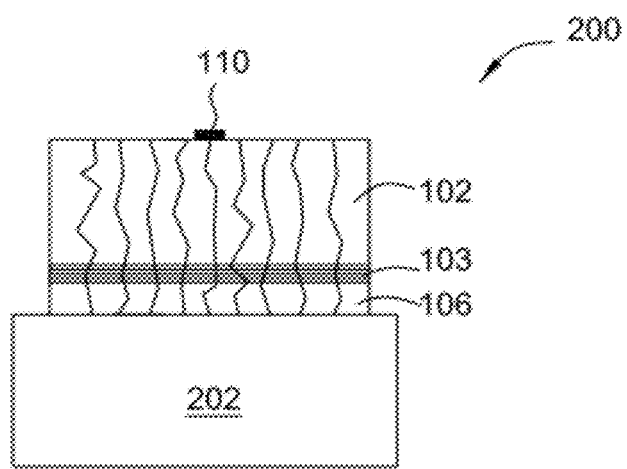
FIG. 2 is a cross-sectional schematic representation of a prior art vertical light-emitting diode (VLED) structure.
Figure 3A:
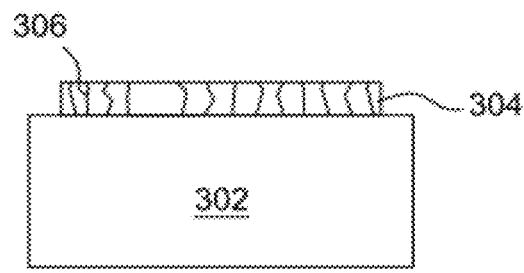
FIGS. 3A-3F illustrate fabrication of an LED with a $Si_xN_y$ layer according to an embodiment of the invention.

In FIG. 3A, a first n-doped layer 304 may be deposited on a carrier substrate 302. The first n-doped layer 304 may comprise any suitable semiconductor material for LED functionality, such as n-doped GaN (n-GaN) or a combination of undoped GaN and n-GaN. Any suitable material such as sapphire, silicon carbide (SiC), silicon, germanium, zinc oxide (ZnO), or gallium arsenide (GaAs) may be used as the carrier substrate 302.

The depositing of the first n-doped layer 304 may be performed using any suitable thin film deposition techniques, such as electrochemical deposition, electroless chemical deposition, chemical vapor deposition (CVD), metal organic vapor phase epitaxy, metal organic CVD (MOCVD), plasma enhanced CVD (PECVD), atomic layer deposition (ALD), physical vapor deposition (PVD), evaporation, plasma spray, or a combination of these techniques. Dislocations 306 may form in the first n-doped layer 304. The thickness of the first n-doped layer 304 may be any suitable thickness, such as in a range from 0.1 to 10 microns. When MOCVD is used to deposit the first n-doped layer, a first n-doped layer thickness of at least 0.5 microns may be suitable for increased light extraction.

Figure 3B:
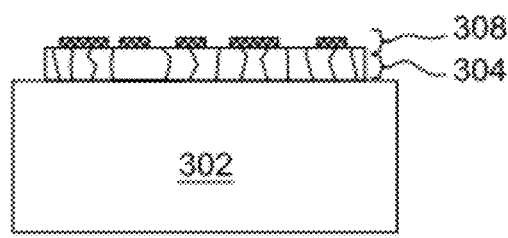

In FIG. 3B, a $Si_xN_y$ mask 308 may be deposited above the first n-doped layer 304. The $Si_xN_y$ mask 308 may partially cover the first n-doped layer leaving a connecting area for the first n-doped layer 304 and a second n-doped layer 310 that may be deposited later (see FIG. 3C). The coverage of the $Si_xN_y$ mask may not be continuous and may leave an area of the first n-doped layer exposed for subsequent growth of another n-doped layer.

The $Si_xN_y$ mask 308 may be deposited by any suitable technique such as depositing individual "islands" through sputtering or by depositing a continuous $Si_xN_y$ layer and then removing parts of the continuous layer to form individual islands. Using MOCVD, the $Si_xN_y$ mask 308 may be grown using silane ($SiH_4$), disilane ($Si_2H_6$), or any derivative of silane ($Si_nH_{2n+2}$) combined with $NH_3$ (or any material containing nitrogen that can decompose at growth temperatures and emits nitrogen).

The $Si_xN_y$ mask may be formed using in situ deposition where the $Si_xN_y$ mask is created in the process chamber and used as a mask in the position where it was created. The $Si_xN_y$ mask 308 may be deposited with any suitable growth temperature that is higher than the growth temperature of GaN (higher by 5 to 100° C.) especially with MOCVD. When the growth temperature of the $Si_xN_y$ mask is higher than the growth temperature of GaN, the leakage current of the LED may be reduced. The shape of the $Si_xN_y$ islands deposited above the first n-doped layer 304 may be any suitable shape created by any of the above-mentioned processes of depositing the $Si_xN_y$ mask such as rectangular, trapezoidal, or pyramidal.

The $Si_xN_y$ mask 308 may be deposited with any suitable thickness as long as the mask does not cover the whole first n-doped layer. Increased coverage of the $Si_xN_y$ mask islands may indicate that a thicker layer may be required to recover a continuous n-doped layer after the $Si_xN_y$ mask. In order to create an LED that is practical for mass production, the coverage of the $Si_xN_y$ mask is chosen so a subsequent n-doped layer recovers after a suitable growth thickness such as 4 to 8 microns. Using MOCVD, the growth pressure of the $Si_xN_y$ mask may not be as important as the growth temperature. As long as the growth temperature of the $Si_xN_y$ mask is higher than the n-doped layer's growth temperature (e.g., 5-100° C. higher), the subsequent n-doped layer (a second n-doped layer described below) may recover with much less leakage current in the resulting LED.

Figure 3C:
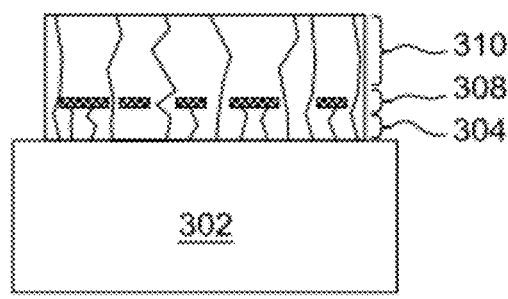

In FIG. 3C, a second n-doped layer 310 may be deposited above the $Si_xN_y$ mask and may be formed using any of the above-described deposition techniques. The second n-doped layer 310 may contain dislocations 306 in areas that were not covered by the $Si_xN_y$ mask 308. Some dislocations may have been prevented from developing above the layer with the $Si_xN_y$ mask 308 in the second n-doped layer 310 resulting in decreased dislocation density in the second n-doped layer 310 and thus, lower leakage current in the resulting LED structure.

Figure 3D:
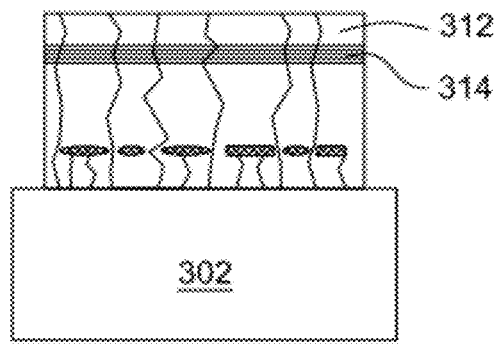
Figure 3E:
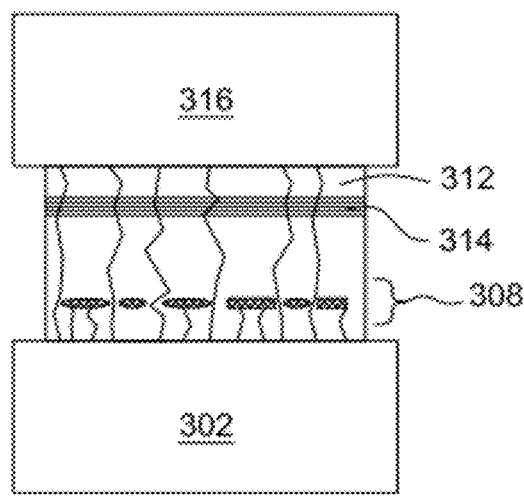

In FIG. 3D, an active layer 314 for emitting light may be deposited above the second n-doped layer, and a p-doped layer 312 may be deposited above the active layer. Both layers 312, 314 may be formed using any of the above-described deposition techniques. In FIG. 3E, one or more metal layers 316 may be deposited above the p-doped layer 312 rather than attached with wafer bonding or gluing. The one or more metal layers 316 may be deposited using any suitable thin film deposition technique, such as physical vapor deposition (PVD), chemical vapor deposition (CVD), plasma enhanced CVD (PECVD), evaporation, ion beam deposition, electrochemical deposition, electroless chemical deposition, plasma spray, or ink jet deposition. The metal layer may comprise any suitable material for electrical and thermal conduction, such as chromium (Cr), platinum (Pt), nickel (Ni), copper (Cu), Cu on a barrier metal material (e.g., titanium nitride, tungsten, tungsten nitride, tantalum nitride), molybdenum (Mo), tungsten (W) or a metal alloy. One or more of the metal layers may be formed by electrochemical plating or electroless chemical plating. One or more metal layers may be deposited on a seed metal layer. The seed metal layer may be grown via electroless plating and assist in the growth of a single metal layer or of multiple metal layers via electroplating.

Figure 3F:
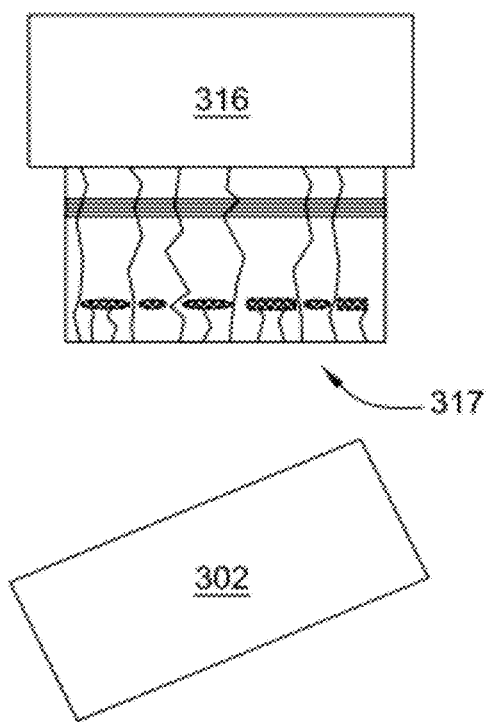

In FIG. 3F, the carrier substrate 302 may be removed. The carrier substrate removal may be done using laser, etching, grinding/lapping, chemical mechanical polishing (CMP), wet etching, or any other suitable technique. After the carrier substrate is removed, the exposed surface 317 of the first n-doped layer may be roughened in an effort to increase the light extraction according to Snell's law. The roughening may occur through any suitable technique such as through a photoelectrochemical oxidation process as described below, by wet etching, or by dry etching. An electrode 318 for external connection may be deposited on the surface 317 after roughening.

Roughening may occur using any suitable process, such as the process described in U.S. Pat. No. 7,186,580 to Tran, issued Mar. 6, 2007 and entitled "LIGHT EMITTING DIODES (LEDS) WITH IMPROVED LIGHT EXTRACTION BY ROUGHENING." One embodiment teaches the photoelectrochemical (PEC) oxidation and etching of the n-doped layer. PEC oxidation and etching may be performed in a system with an aqueous solution, an illumination system, and an electrically biased system. The aqueous solution may be a combination of oxidizing agent and either acid or alkaline solutions. The oxidizing agent may be any suitable agent such as one or the combination of $H_2O_2$ and $K_2S_2O_8$, among others. The acid solution may be any suitable solution, such as one or more of $H_2SO_4$, HF, HCl, $H_3PO_4$, $HNO_3$, and $CH_3COOH$. The alkaline solution may be any suitable solution, such as one or the mixture of KOH, NaOH, and $NH_4OH$. The illumination may be performed through any suitable method, such as by an Hg or Xe arc lamp system with wavelength ranging from the visible to the ultraviolet spectrum. The illumination may be exposed on the n-type III-nitride semiconductors with an intensity less than 200 mW/cm². An electrical bias may be applied to the conductive substrate, and the voltage may be controlled between −10 and +10 V. The oxidation-dominant, the etching-dominant, or the combined reactions may be controlled in any suitable method, such as being controlled to optimize the roughness of the n-GaN surface by varying the constitution of the aqueous solution, the electrical bias, and/or the illumination intensity. The non-ordered textured morphology also may be revealed after the roughening process.

Figure 4A:
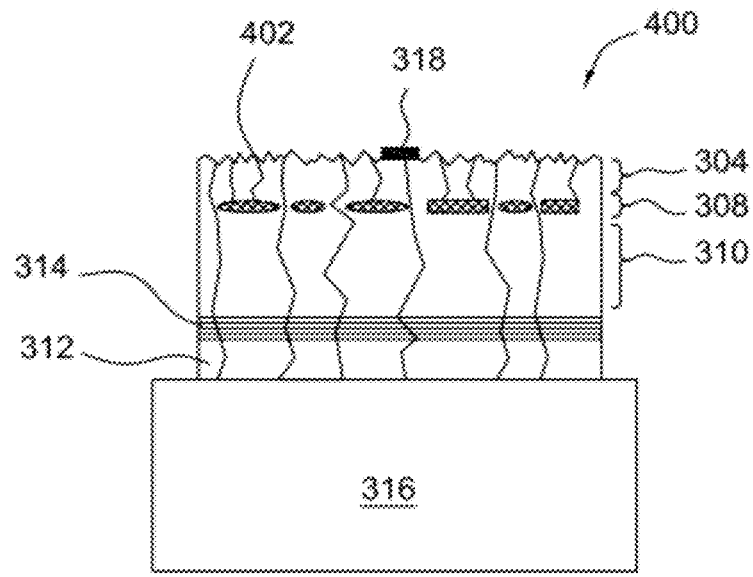
FIGS. 4A and 4B are cross-sectional schematic representations of LED structures fabricated with a $Si_xN_y$ layer with different amounts of etching according to embodiments of the invention.

FIG. 4A illustrates a cross-sectional schematic representation of a light-emitting diode (LED) structure 400 according to an embodiment of the invention. After the above-described process, the $Si_xN_y$ mask 308 may partially cover the first n-doped layer 304, and a surface 402 of the first n-doped layer 304 may have been roughened as described above.

Figure 4B:
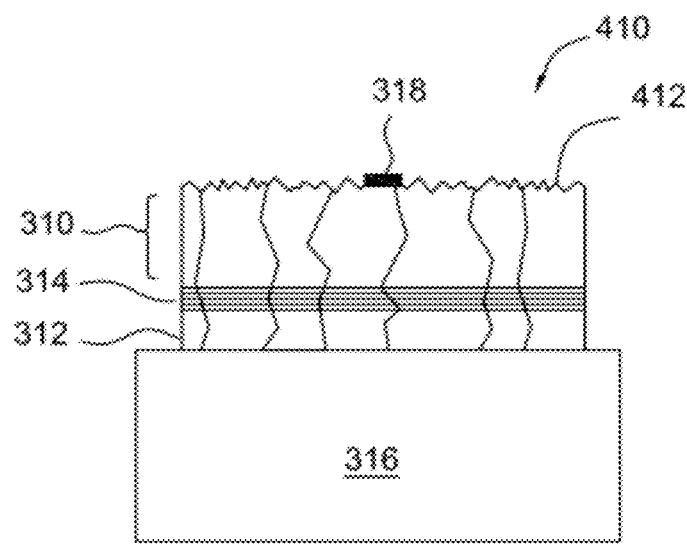

The LED 410 illustrated in FIG. 4B results from the roughening process described in FIG. 4A continuing until the $Si_xN_y$ mask 308 has been removed. Part of the second n-doped layer 310 may be removed, as well. An electrode 318 may be disposed on the roughened surface 412 as illustrated in FIG. 4B. The roughened surface 412 of the LED may most likely result in greater light extraction than if the $Si_xN_y$ mask was not present initially.

An Exemplary Surface Roughness Due to the $Si_xN_y$ Layer

The presence of $Si_xN_y$ mask "islands" partially covering the first n-doped layer 304 may reduce the dislocation density in one or more of the second n-doped layer 310, the active layer 314 and the p-doped layer 312. In certain LEDs, current flows along the direction of the dislocations and so more dislocations can mean more leakage current in the LED. The reduction of the dislocation density may most likely reduce the leakage current in the LED.

Additionally, the presence of the $Si_xN_y$ mask may provide for increased light extraction from the surface 402, when roughened. The presence of the $Si_xN_y$ mask "islands" may alter the roughening process and create a more even roughening with greater surface area on the exposed surface of the first n-doped layer or the second n-doped layer and increased light extraction from the LED. An LED with a $Si_xN_y$ mask as described above may provide for more even roughening on the first or the second n-doped layer depending on the depth of etching and, hence, more light extraction than a conventional LED without the $Si_xN_y$ mask.

The presence of the $Si_xN_y$ mask partially covering the first n-doped layer, once exposed by removing the first n-doped layer, may lead to differently shaped surface structures on the second n-doped layer (e.g., higher density of the pyramid structures at the surface resulting in a greater effective surface area for photons to escape) when compared to other LED structures fabricated without the $Si_xN_y$ mask. Resulting surface structures created on the second n-doped layer may be high density smaller pyramidal or conical structures. These structures may increase the light extraction of the LED. Therefore, the $Si_xN_y$ mask may not only decrease the leakage current, but may also increase the light extraction of the LED.

Figure 5A:
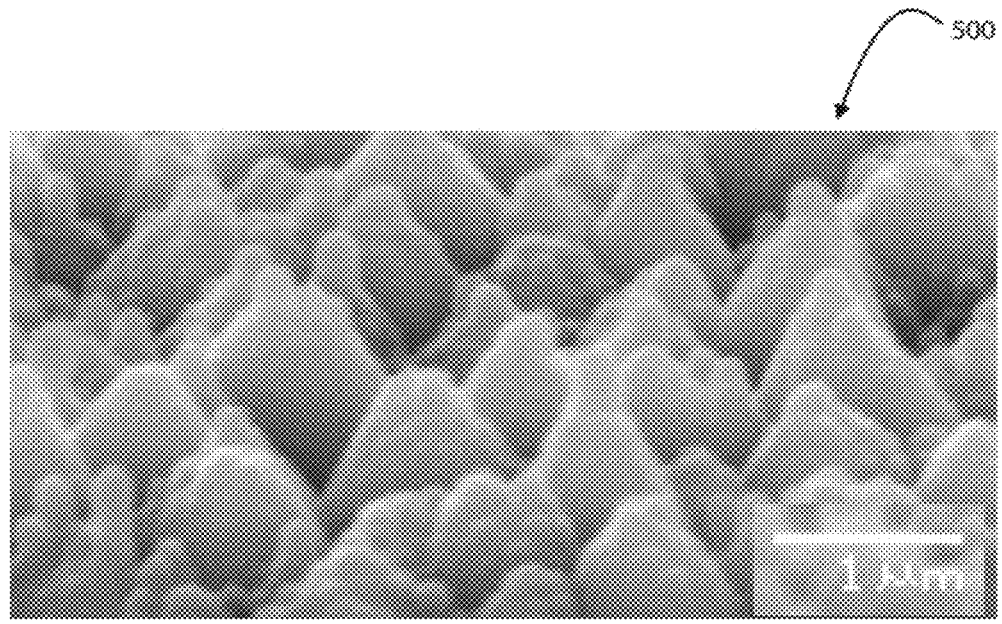
FIGS. 5A and 5B compare surface views of n-doped layers of LED structures fabricated without and with a $Si_xN_y$ layer, respectively.
Figure 5B:
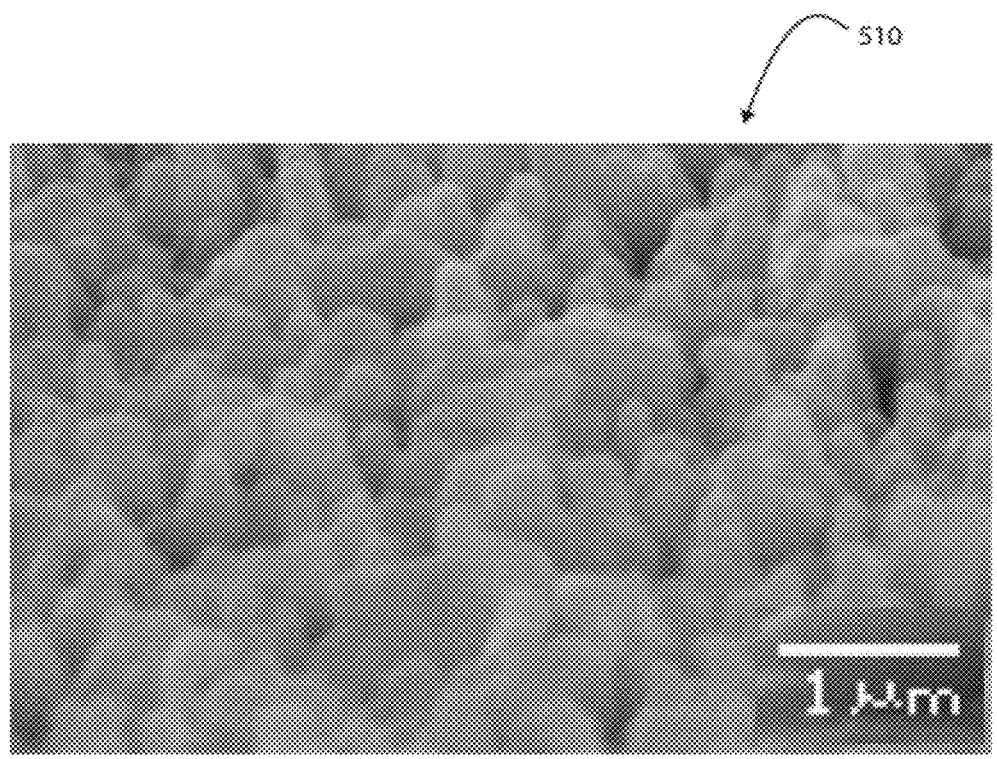

FIGS. 5A and 5B illustrate exemplary surfaces that may occur after roughening. The light-emitting surface 510 of the second n-doped layer in an LED fabricated with a $Si_xN_y$ mask shown in FIG. 5B has more even roughening with higher density of pyramidal structures resulting in greater surface area than the light-emitting surface 500 of the n-doped layer in an LED fabricated without the $Si_xN_y$ mask shown in FIG. 5A. Therefore, the LED fabricated with a $Si_xN_y$ mask and second n-doped layer exposed as shown in FIG. 5B may most likely have more light extraction according to Snell's Law and, thus, greater luminous efficiency when compared to LEDs fabricated without the $Si_xN_y$ mask.

Another Exemplary Led Device Having a $Si_xN_y$ Layer

As described above, unwanted dislocations may form in an LED during the growing of one or more of the layers that make up the LED. The depositing of a $Si_xN_y$ layer may reduce the dislocation density in the layers of an LED and lead to increased light extraction.

Figure 6A:
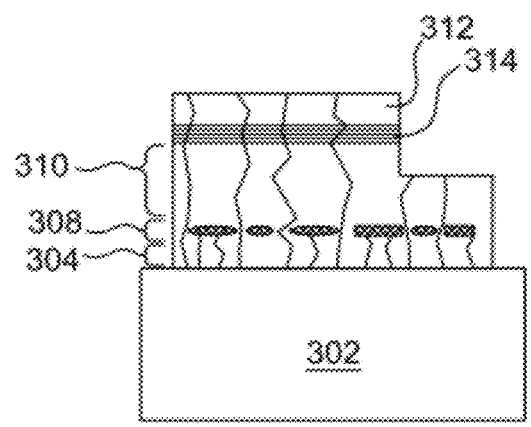
FIGS. 6A and 6B illustrate fabrication of an LED with a $Si_xN_y$ layer according to embodiments of the invention.
Figure 6B:
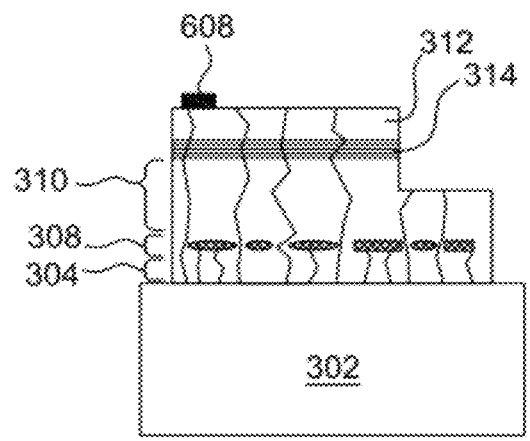
Figure 6C:
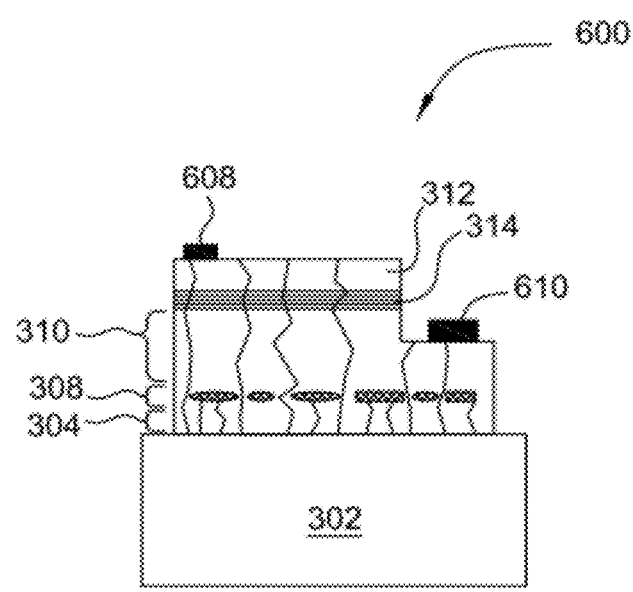
FIG. 6C is a cross-sectional schematic representation of an LED structure fabricated with a $Si_xN_y$ layer according to an embodiment of the invention.

FIG. 6C illustrates a cross-sectional schematic representation of an LED structure 600 according to an embodiment of the invention. The LED structure 600 may be fabricated as described above with reference to FIGS. 3A-D. Thereafter, portions of the p-doped layer 312 and the active layer 314 may be removed to expose a portion of the second n-doped layer 310, as illustrated in FIG. 6A. As shown in FIG. 6B, a p-electrode 608 may be deposited on the p-doped layer 312. For some embodiments, as illustrated in FIG. 6C, an n-electrode 610 may be deposited on the second n-doped layer 310, for forward biasing the LED.

The presence of the $Si_xN_y$ mask 308 partially covering the first n-doped layer 304 may reduce the dislocation density in at least one of the second n-doped layer 310, the active layer 314, and the p-doped layer 312 (La, in layers above the $Si_xN_y$ mask 308). For example, some dislocations may have been prevented from developing above the layer with the $Si_xN_y$ mask 308 in at least the second n-doped layer 310, as illustrated in FIG. 3C. As a result, the reduction of the dislocation density may most likely reduce the leakage current in the LED structure 600, thereby leading to increased light extraction from an upper surface of the p-doped layer 312.

While the foregoing is directed to embodiments of the present invention, other and further embodiments of the invention may be devised without departing from the basic scope thereof, and the scope thereof is determined by the claims that follow.

The invention claimed is:

1. A method of increasing light extraction from a light-emitting diode (LED) device comprising;
    forming a first n-doped layer on a carrier substrate;
    forming a $Si_xN_y$ mask on the first n-doped layer;
    forming a second n-doped layer on the $Si_xN_y$ mask;
    forming an active layer configured to emit light on the second n-doped layer;
    forming a p-doped layer on the active layer;
    removing the carrier substrate; and
    forming a plurality of structures on the second n-doped layer by removing the first n-doped and the $Si_xN_y$ mask and then roughening a surface of the second n-doped layer.

2. The method of claim 1 wherein the forming the plurality of structures step comprises etching.

3. The method of claim 1 wherein the forming the plurality of structures step comprises photoelectrochemical (PEC) oxidation and etching.

4. The method of claim 1 wherein the $Si_xN_y$ mask is configured to reduce dislocations in the second n-doped layer during the forming the plurality of structures step.

5. The method of claim 1 wherein the $Si_xN_y$ mask is configured to reduce dislocations in the active layer during the forming the plurality of structures step.

6. The method of claim 1 wherein the $Si_xN_y$ mask is configured to reduce dislocations in the p-doped layer during the forming the plurality of structures step.

7. The method of claim 1 wherein the $Si_xN_y$ mask is configured to increase a density of the structures relative to forming the structures without the $Si_xN_y$ mask.

8. The method of claim 1 wherein the $Si_xN_y$ mask is configured to increase a surface area of the structures relative to forming the structures without the $Si_xN_y$ mask.

9. The method of claim 1 wherein the forming the plurality of structures step comprises etching to remove portions of the second n-doped layer.

10. The method of claim 1 further comprising
forming a p-electrode on the p-doped layer.

11. The method of claim 1, further comprising:
forming an n-electrode on the second n-doped layer.

12. The method of claim 1 wherein the $Si_xN_y$ mask is configured to reduce current leakage in the LED device.

13. A light-emitting diode (LED) device comprising:
a carrier substrate;
a first n-doped layer on the carrier substrate having a first dislocation density;
a $Si_xN_y$ mask on the first n-doped layer;
a second n-doped layer on the $Si_xN_y$ having a plurality of structures configured to increase light extraction and a second dislocation density lower than the first dislocation density, the $Si_xN_y$ mask located between the first n-doped layer and the second n-doped layer and configured to lower the second dislocation density and form the structures with an increased density and surface area;
an active layer configured to emit light on the second n-doped layer; and
a p-doped layer on the active layer.

14. The LED device of claim 13 wherein the $Si_xN_y$ mask is configured to reduce dislocations in the active layer.

15. The LED device of claim 13 wherein the $Si_xN_y$ mask is configured to reduce dislocations in the p-doped layer.

16. The LED device of claim 13 further comprising:
a p-electrode on the p-doped layer.

17. The LED device of claim 13 further comprising:
an n-electrode on the second n-doped layer.

18. The LED device of claim 13 further comprising a metal layer on the p-doped layer.

* * * * *